United States Patent
Shearer et al.

(10) Patent No.: US 8,221,518 B2
(45) Date of Patent: Jul. 17, 2012

(54) CONDUCTIVE COMPOSITIONS CONTAINING BLENDED ALLOY FILLERS

(75) Inventors: Catherine Shearer, San Marcos, CA (US); Kenneth C. Holcomb, San Diego, CA (US); G. Delbert Friesen, Huntington Beach, CA (US); Michael C. Matthews, Encinitas, CA (US)

(73) Assignee: Ormet Circuits, Inc., San Diego, CA (US)

( * ) Notice: Subject to any disclaimer, the term of this patent is extended or adjusted under 35 U.S.C. 154(b) by 0 days.

(21) Appl. No.: 12/751,030

(22) Filed: Mar. 31, 2010

(65) Prior Publication Data

US 2010/0252616 A1 Oct. 7, 2010

Related U.S. Application Data

(60) Provisional application No. 61/166,015, filed on Apr. 2, 2009.

(51) Int. Cl.
*B22F 1/00* (2006.01)
*B23K 31/00* (2006.01)

(52) U.S. Cl. ....... 75/252; 252/513; 252/514; 228/248.1; 228/249

(58) Field of Classification Search .......... 75/252, 75/255; 148/24; 252/514; 228/122.1, 123.1, 228/124.5, 180.1
See application file for complete search history.

(56) References Cited

U.S. PATENT DOCUMENTS

| | | |
|---|---|---|
| 5,043,102 A | 8/1991 | Chen et al. |
| 5,088,189 A | 2/1992 | Brown |
| 5,376,403 A | 12/1994 | Capote et al. |
| 5,463,190 A | 10/1995 | Carson et al. |
| 5,565,267 A | 10/1996 | Capote et al. |
| 5,639,556 A | 6/1997 | Gaumet |
| 5,716,663 A | 2/1998 | Capote et al. |
| 5,830,389 A | 11/1998 | Capote et al. |
| 5,853,622 A | 12/1998 | Gallagher et al. |
| 5,922,397 A | 7/1999 | Brandt et al. |
| 5,948,533 A | 9/1999 | Gallagher et al. |
| 5,980,785 A | 11/1999 | Xi et al. |
| 6,054,761 A | 4/2000 | McCormack et al. |
| 6,068,782 A | 5/2000 | Brandt et al. |
| 6,085,415 A | 7/2000 | Gandhi et al. |
| 6,114,413 A | 9/2000 | Kang et al. |
| 6,127,619 A | 10/2000 | Xi et al. |
| 6,132,646 A | 10/2000 | Zhou et al. |
| 6,139,777 A | 10/2000 | Omoya et al. |
| 6,143,116 A | 11/2000 | Hayashi et al. |
| 6,207,259 B1 | 3/2001 | Iino et al. |
| 6,297,559 B1 | 10/2001 | Call et al. |
| 6,337,522 B1 | 1/2002 | Kang et al. |
| 6,370,013 B1 | 4/2002 | Iino et al. |
| 6,716,036 B2 | 4/2004 | Gandhi |
| 6,896,172 B2 * | 5/2005 | Taguchi et al. ............ 228/180.1 |
| 7,022,266 B1 | 4/2006 | Craig |
| 7,214,419 B2 | 5/2007 | Umeda et al. |
| 2001/0044590 A1 | 11/2001 | Ceriani et al. |
| 2002/0051728 A1 | 5/2002 | Sato et al. |
| 2004/0265608 A1 | 12/2004 | Pecorini et al. |
| 2008/0023665 A1 | 1/2008 | Weiser et al. |
| 2008/0207814 A1 | 8/2008 | Wrosch et al. |
| 2009/0155608 A1 * | 6/2009 | Nomura et al. ............... 428/457 |

FOREIGN PATENT DOCUMENTS

| | | |
|---|---|---|
| JP | 53-133799 | 11/1978 |
| JP | 03187373 | 7/2001 |
| WO | 9839105 | 9/1998 |
| WO | 0059645 | 10/2000 |
| WO | 2010114874 A3 | 10/2010 |
| WO | WO 2010114874 | 10/2010 |
| WO | 2011078918 A2 | 6/2011 |
| WO | 2011078918 A3 | 10/2011 |

* cited by examiner

*Primary Examiner* — Roy King
*Assistant Examiner* — Ngoclan T Mai
(74) *Attorney, Agent, or Firm* — The Law Office of Jane K. Babin, Professional Corporation; Jane K. Babin

(57) ABSTRACT

The present invention provides electrically and thermally conductive compositions for forming interconnections between electronic elements. Invention compositions comprise three or more metal or metal alloy particle types and an organic vehicle comprising a flux that is application specific. The first particle type includes a reactive high melting point metal that reacts with a reactive low melting point metal(s) in the other particles to form intermetallic species. The reactive low melting point metal(s) of the invention are provided in two distinct particle forms. The first reactive low melting point metal particle includes a carrier that facilitates the reaction with the reactive high melting point metal. The second reactive low melting point metal particle acts primarily as a source of the reactive low melting point metal. Combination of the three particle types provides several advantages including reduction of the undesirable characteristics of the carrier metal while preserving and, in some embodiments, enhancing, the advantageous facilitation of the metallic reaction.

37 Claims, 6 Drawing Sheets

CONDUCTIVE COMPOSITIONS CONTAINING BLENDED ALLOY FILLERS

CROSS REFERENCE TO RELATED APPLICATIONS

This application claims the benefit of priority under 35 USC §119 of U.S. Provisional Application Ser. No. 61/166,015 filed Apr. 2, 2009, the entire disclosure of which is incorporated herein by reference.

FIELD OF THE INVENTION

The present invention relates to metal compositions, methods of preparation and uses therefor. More specifically, the present invention relates to conductive metal compositions utilizing blended alloy fillers.

BACKGROUND OF THE INVENTION

Over the last few decades, the electronics industry has continually driven towards higher performance and functionality in smaller form factors. At the production level, these driving forces have translated into smaller circuit features, designs and manufacturing methods that support more efficient circuit routing, elimination of layers of packaging, and sophisticated engineered materials. Issues that have been exacerbated by these trends include thermal management and management of the thermo-mechanical stresses generated by close juxtaposition of dissimilar materials.

One example of how the design of printed circuit boards and semiconductor packaging has changed to facilitate improvements in density is how the layers of circuitry are interconnected. In order to optimize circuit routing for speed and performance, it is necessary to shift from a through hole vertical interconnection architecture to a direct layer-to-layer interconnection architecture. Ideally the conductive vias that interconnect layers of circuitry are commensurate in size with the circuit traces that they interconnect, provide rugged and reliable conduction, require very small connecting circuit features, and can be stacked and otherwise freely placed anywhere in the circuit board or package design.

It is cost prohibitive to plate solid metal vias to form such layer-to-layer interconnections and entrapment of plating solution is a significant issue. The prevalent solution is to plate the topography of the via hole to a reasonable thickness. This strategy creates mechanical stress points at the edge of the via and where the plating connects with the underlying pad. The dimple created in the center of the via is also a potential source of defects. One solution is to fill the via hole with a conductive compound, but prior art via fill materials do not form electrically robust interfaces with the copper pads.

In addition to miniaturization of electronic devices, there is an emerging trend to integrate devices or elements thereof directly into other objects. Realization of these types of devices will require truly 3-D architectures and manufacturing methods. Innovative interconnection strategies will be required for applications as diverse as interconnecting the I/Os of stacked semiconductor die, creating conformable or embedded antenna structures for wireless devices and creating collection grids on solar panels.

An additional major trend in the electronics industry is the reduction and elimination of environmental hazards and toxins, including volatile organic compounds and lead. The elimination of lead in particular has complicated the manufacture of electronic devices as this element has been used extensively in the past. High tin alloys have emerged as a replacement for tin-lead. But these high tin alloys have melting temperatures roughly 30° C. higher than the prior tin-lead alloys, resulting in commensurate increases in component assembly process temperatures. The higher process temperatures increase the thermo-mechanical stresses on the increasingly fine-featured electrical interconnects.

As semiconductor packaging and printed circuit board production converge, substantial engineering effort has been devoted to the creation of materials than can withstand the rigors of the new architectures and processing regimes. For instance, the microstructure of the copper foils used to produce the fine circuits is extensively controlled. Another example would be the composite laminates used to create circuit substrates which have undergone extensive product development to control flow characteristics, glass transition temperature, coefficient of thermal expansion, and high quality hole formation. Surface preparation chemistries and primer coatings have also been extensively characterized and optimized. Barrier metals and surface finishes are applied to strict tolerances and dopants are added to solder materials to improve the mechanical characteristics of solder joints and prevent undesirable microstructures such as tin whiskers from forming.

A promising new material type that may satisfy many of the industry requirements for interconnection challenges is liquid phase sintering (TLPS) materials, which were introduced as a reliable and versatile conductives that could be applied to support a variety of configurations. Primarily lead-based commercial alloys were blended with copper particles in a fluxing binder to create these compositions.

The compositions could be processed like conventional lead-tin solders and formed robust metallurgical junctions to solder wettable surfaces, but, unlike solder, the compositions essentially created a metal "thermoset" during processing. This "thermosetting" characteristic was advantageous because the paste materials could be used on or in the circuit boards, or in operations in which step soldering was typically required, and the processed composition would not re-melt at the original process temperature.

These early TLPS materials were designed as a simple "thermosetting solder" with a self-inerting flux. The requirements for these early TLPS materials were that they metallurgically react to form a highly electrically conductive interconnection, remain solid through subsequent thermal processing, self-inert, and present a reasonably solderable surface. The microstructure of the metal network formed and the surrounding organic matrix were optimized only to the extent that electrical conductivity or characteristics such as adhesion were improved. The size of the interconnections was relatively large and the processed TLPS materials were rarely subjected to subsequent thermal excursions in excess of 220° C.

The early TLPS materials benefited from the availability of lead as a constituent material. Lead based solders offer a low process temperature, excellent wetting of copper, reasonably good electrical and thermal conductivity, and ductile, predominantly lead, bridges between the copper-tin intermetallic sheathed copper particles in the cured composition. Elimination of lead as a viable constituent metal presented a significant challenge to realizing the potential of the technology.

Despite the above described measures and advances, there still remains a need for compositions and methods for making thereof that can provide an inexpensive, robust, low process temperature, and reliable electrical and thermal interconnection strategy at several critical junctions within electronic devices. The present application provides such compositions and devices.

SUMMARY OF THE INVENTION

The present invention is directed to metallurgical compositions that can be processed at temperatures below 300° C., with a high specificity of metallurgical component selection, as well as intermetallic products and interconnected networks thereof. The compositions have high tolerance to thermomechanical stress and possess thermally stable bulk and interfacial electrical and thermal resistance. The compositions are optionally lead-free, and may additionally comprise organic compounds that are application-specific to the adherands and surrounding materials.

The metallic constituents in the inventive compositions undergo reactions that can be thought of as analogous to organic chemistry reactions. How the metallic reagents are introduced, the proportion of metallic reagents, and the presence of other metallic species, even in very small quantities, has a substantial impact on the products of the reaction. The metallic products formed by reaction of the invention compositions include both alloys (solid solutions) and intermetallics (crystalline structures with specific proportions of elements). Much as reagents in organic chemistry are often introduced with facilitating groups (e.g. leaving groups such as halogens or para-toluenesulfonate) some of the metallic reagents in the invention compositions are introduced with metallic constituents that facilitate formation of the desired end products. Also like organic reactions, some inventive compositions employ metallic constituents that create a catalytic effect on the metallic reactions.

For the purpose of clarity, metallic elements in the inventive compositions that undergo reactions to form intermetallic species are designated by terms "reactive HMP metal" and "reactive LMP metal". In the practice of the invention, relatively high-melting-point reactive metal elements ($\geqq 400°$ C.) are reacted with relatively low-melting-point reactive metal elements (<400° C.). The reaction is facilitated by one or more facilitating metallic elements referred to as carriers. Each of the metallic elements is present in the composition in a particulate form. The particles may be of substantially one metallic element or may be particles of an alloy of two or more metallic elements.

In some embodiments of the invention, the primary reactive LMP metal is present in the composition in two readily differentiated sets of particles.

More specifically, in some embodiments, the invention provides compositions including a mixture of particles, that includes between about 30 mass % and about 70 mass % of a first metallic particle, comprising at least one high melting point metal; between about 10 mass % and about 60 mass % of a second metallic particle comprising an alloy of a reactive, low melting point metal, and a carrier metal, wherein the reactive, low melting point metal is capable of reacting with the high melting point metal to form an intermetallic; between about 25 mass % and about 75 mass % of a third metallic particle comprising at least 40 mass % of the reactive, low melting point metal; and an organic vehicle. In some aspects, the reactive, low melting point metal comprises between about 35 mass % and about 50 mass % of the second metallic particle, such as about 40 mass % of the second metallic particle. In some aspects, the reactive LMP metal comprises at least 90 mass % of the third metallic particle.

The high melting point metal can be selected from the group consisting of Cu, Ag, Al, Au, Pt, Pd, Be, Rh, Ni, Co, Fe, Mo and combinations thereof; or more specifically from Cu, Ag, Al, Au, Ni, and combinations thereof, and particularly from Cu, Ag and mixtures thereof, such as Cu or Ag. The first metallic particle can be a mixture of elements, or an alloy, or can be comprised substantially of one element.

The reactive, low melting point metal can be selected from the group consisting of Sn, Bi, Zn, Ga, In, Te, Hg, Tl, Sb, Se, Po and combinations thereof; or more specifically from Sn, Bi, Ga, In and combinations thereof; such as Sn. In certain embodiments of the invention, the reactive metal is Sn, and high melting point metal is Cu or Ag.

The carrier metal can be Bi, In, Pb, Ag, Cu, Sb, Au, Ni or combinations thereof. In certain aspects, the reactive metal is Sn and the carrier metal is Bi.

The second metallic particle can include at least one of the alloy families selected from the group consisting Bi/Sn, In/Sn, Pb/Sn, Sn/Pb/Bi, Sn/Ag, Sn/Cu, Sn/Ag/Cu, Sn/Ag/Cu/Sb, Bi/In/Sn, Sn/In/Ag, Sn/Sb, Au/Sn and combinations thereof.

The third metallic particle can include an alloy of the reactive, low melting point metal or can consist essentially of the reactive, low melting point metal in elemental form. In certain aspects, the third metallic particle includes at least 90 mass % of the reactive, low melting point metal.

In certain aspects of the invention, the low melting point (LMP) metal is Sn and the high melting point (HMP) metal is Cu, and there is insufficient Sn in the second metallic particle to convert all of the Cu in the first metallic particle to Cu/Sn intermetallics. In yet further embodiments, there is sufficient Sn in the second metallic particle plus the third metallic particle to convert substantially all of the Cu in the first metallic particle to Cu/Sn intermetallics.

In further embodiments, the high melting point metal forms intermetallic species with the reactive, low melting point metal at temperature $T_1$, where $T_1$ is in the range between about 80° C. and about 300° C., with the further proviso that the intermetallic species have a minimum melting temperature not less than 10° C. above $T_1$. The intermetallic species can further be joined to form an interconnected network.

In some aspects of the invention, the second metallic particle is molten at temperature $T_1$, (i.e., between about 80° C. and about 300° C., or between about 100° C. and about 230° C., such as 190° C.-210° C.), and the third metallic particle is not.

The particles can include ones that have a metallic coating on a non-metallic core, such as glass, ceramic or polymeric core. In yet other embodiments, one or more particle can be sieved to remove particles above a certain size, which can be about 20 μm.

Also provided by the invention are intermetallic products formed from the aforementioned compositions by thermal processing at a temperature between about 80° C. and 300° C.

Further provided are methods for fabricating the composition of the invention by combining a predetermined ratio of the first metallic particle, the second metallic particle, the third metallic particle and the organic vehicle to form a mixture of components, where the organic vehicle holds the particles together in a mixture and typically comprises a flux. The organic vehicle can also contain resins, polymers, reactive monomers, volatile solvents and other fillers.

The present invention also provides methods for making an electrically and thermally conductive interconnection by applying an amount of the particle mixture compositions described herein to an assembly of at least two parts, where the at least two parts are to be electrically and thermally joined together, heating the composition to a temperature $T_1$, wherein $T_1$ is between about 80° C. and about 300° C. (e.g. between about 100° C. and about 200° C.), wherein the high and low melting temperature metals in the composition react to form an intermetallic, wherein the intermetallic is electrically and thermally conductive. In some aspects, the intermetallic species have a melting temperature that is at least 10° C. higher than the processing temperature $T_1$.

DETAILED DESCRIPTION

Figure 1:
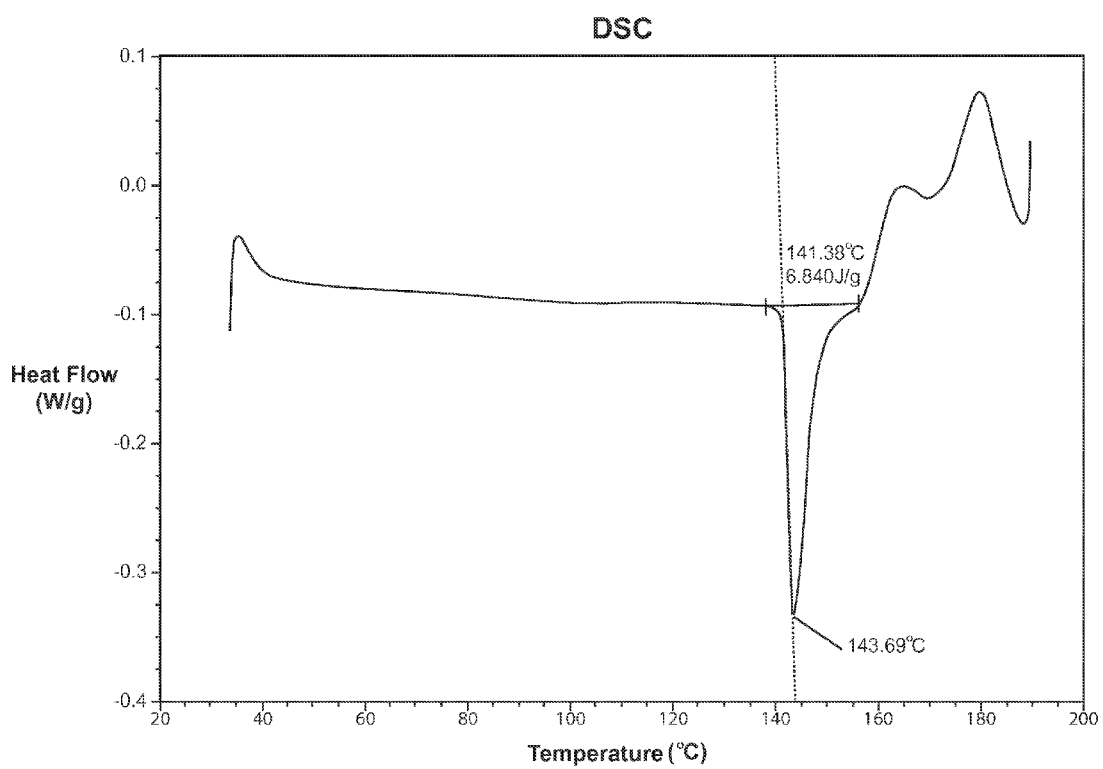
FIG. 1 is a differential scanning calorimetry (DSC) diagram illustrating processing of the non-standard alloy TLPS composition at 190° C.

It is to be understood that both the foregoing general description and the following detailed description are exemplary and explanatory only and are not restrictive of the invention claimed. As used herein, the use of the singular includes the plural unless specifically stated otherwise.

As used herein, "or" means "and/or" unless stated otherwise. Furthermore, use of the term "including" as well as other forms, such as "includes," and "included," is understood as "comprising" and is not limiting. The section headings used herein are for organizational purposes only and are not to be construed as limiting the subject matter described.

Whenever it appears herein, a numerical range of integer value such as "1 to 20" refers to each integer in the given range; e.g., "1 to 20 percent" means that the percentage can be 1%, 2%, 3%, etc., up to and including 20%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

Terms, Definitions, and Abbreviations

The term "about" as used herein means that a number referred to as "about" comprises the recited number plus or minus 1-10% of that recited number. For example, "about" 100 degrees can mean 95-105 degrees or as few as 99-101 degrees depending on the situation.

The term "alloy" refers to a mixture containing two or more metals, and optionally additional non-metals, where the elements of the alloy are fused together or dissolving into each other when molten.

"Flux" as used herein, refers to a substance, often an acid or base, that to promote fusing of metals and in particular, removes and prevents the formation of metal oxides.

The terms "melting temperature" or "melting point," as used herein, refer to the temperature (a point) at which a solid becomes a liquid at atmospheric pressure.

The terms "high melting temperature metal", "high melting point metal" or "HMP metal" as used herein, refers to a metal having the melting temperature that is equal to, or higher than, about 400° C.

The terms "low melting temperature metal", "low melting point metal" or "LMP metal" as used herein, refers to a metal having the melting temperature that is lower than about 400° C.

The term "eutectic" refers to a mixture or an alloy in which the constituent parts are present in such proportions that the melting point is as low as possible, the constituents melting simultaneously. Accordingly, a eutectic alloy or mixture solidifies at a single temperature.

The term "non-eutectic" refers to a mixture or an alloy that does not possess eutectic properties. Accordingly, when a non-eutectic alloy solidifies, its components solidify at different temperatures, exhibiting a melting range.

The term "differential scanning calorimetry" ("DSC") refers to a method of thermal analysis in which the difference in the amount of heat required to increase the temperature of a sample and reference are measured as a function of temperature.

The term "sintering" refers to a process in which adjacent surfaces of metal powder particles are bonded by heating. "Liquid phase sintering" refers to a form of sintering in which the solid powder particles coexist with a liquid phase. Densification and homogenization of the mixture occur as the metals diffuse into one another and form new alloy and/or intermetallic species.

The term "transient liquid phase sintering" or "TLPS," with the reference to powders, describes a process in which the liquid only exists for a short period of time as a result of the homogenization of the metals to form a mixture of solid alloy and/or intermetallic species. The liquid phase has a very high solubility in the surrounding solid phase, thus diffusing rapidly into the solid and eventually solidifying. Diffusional homogenization creates the final composition without the need to heat the mixture above its equilibrium melting temperature.

The term "processing temperature" or "$T_1$," refers to a temperature at which a reactive metal and a HMP metal (both of which are described and discussed in detail below in the application) form intermetallic species.

The terms "intermetallics" or "intermetallic species" refer to a solid material, which is comprised of two or more metal atoms in a certain proportion, that has a definite structure which differs from those of its constituent metals.

The term "bulk resistivity" refers to the inherent electrical resistance of a material "in bulk," i.e., regardless of the shape or size.

In TLPS compositions comprising powder metallurgy, two or more relatively low melting point (LMP) alloys and a relatively high melting point (HMP) metal are mixed in particulate form. At least one element within each alloy is reactive with the HMP metal. In some embodiments, the reactive LMP metal alloys share one reactive LMP in common. As the temperature is raised to the processing temperature $T_1$, one or more of the alloy particle types become molten. This transition can be observed as an endothermic event in differential scanning calorimetry (DSC). The reactive element(s) within the relatively LMP alloys then react with the receptive HMP metal to form intermetallics. The residual LMP alloy constituents form new alloy compositions. The formation of intermetallic species may be observed as an exothermic event by DSC. Thus, the typical TLPS DSC "signature" is an endotherm followed by an exotherm. The diffusion and reaction of the reactive element(s) from the LMP alloys and the receptive HMP metal continues until the reactants are either fully depleted, there is no longer a molten phase at the process temperature, or the reaction is quenched by cooling the mixture. After cooling, subsequent temperature excursions, even beyond the original melt temperatures, do not reproduce the original melt signature of the mixture. This is the "signature" of a typical low temperature post-processing transient liquid phase sintered metal mixture.

As suggested above, however, TLPS is limited by the proportions of the LMP metal and HMP metal, one of which may become exhausted during processing to intermetallic species. When the LMP metal is in excess, in prior art single LMP alloy TLPS compositions, the residual carrying metal (e.g. Bi) with less desirable properties is also in large proportion in the processed mixture. Conversely, when the HMP metal is in excess, once the LMP metal in the alloy has been exhausted, the ability to form additional intermetallics between the HMP metal and the LMP metal has been exhausted.

The present invention is based on the observation that adding a third component to the TLPS mixture vastly improves the amount of both HMP and LMP metals that are converted to intermetallics during TLPS. This third component includes an elemental or highly enriched form of the LMP metal. Thus, the third component has a high percentage of the LMP metal. Without wishing to be bound to a particular theory, it is believed that as the LMP metal in the LMP alloy irreversibly reacts with the HMP metal, the elemental form of the LMP metal replenishes the LMP metal in the LMP metal alloy. Unexpectedly, this replenishment occurs even when the selected process temperature is below the melting temperature of the LMP rich particles. In this way, more intermetallic can be formed from a fixed amount of either the HMP metal or the LMP metal alloy, while at the same time reducing the residual LMP alloy and the undesirable characteristics of the alloying carrier metal.

Compositions of the Present Invention

The present invention thus provides compositions containing three types of metallic particles in an organic vehicle: a high melting point metal particle, a low melting point metal alloy particle, and a particle containing a high percentage of low melting point metal, such as an elemental or enriched form of the low melting point metal. In certain embodiments, the composition includes the following components:
  (A) between about 30 mass % and about 70 mass % of a first metallic particle that includes at least one HMP metal (i.e. a high melting point metal particle or HMP metal particle);
  (B) between about 10 mass % and about 60 mass % of a second metallic particle that includes a reactive LMP metal alloy (i.e. a low melting point metal alloy particle or LMP metal alloy particle); and
  (C) between about 25 mass % and about 75 mass % of a third metallic particle component that includes at least 40 mass % of the LMP metal (i.e., a low melting point metal-rich particle or LMP metal-rich particle, which can be enriched for the low melting point metal or comprise a substantially pure, elemental form of the low melting point metal).

Also present in the compositions of the invention is an organic vehicle which serves both to hold the particles together as a mixture and as flux, as described in greater detail below.

The first metallic particle (Component (A), above) includes at least one HMP metal, which will typically have its melting point above about 400° C. In some embodiments, the metallic particles containing the HMP metal are substantially of one element. As used herein, "substantially" refers to a component that is at least about 95%, typically at least about 98%, often at least about 99% and most frequently at least about 99% of the species or element that is described as substantially containing. Thus, the HMP metal that is substantially made of one element may contain up to 5% impurities.

The HMP metal constitutes between about 30 mass % and about 70 mass % of the total metallic constituents of the composition. Typical HMP metal(s) that may be used include Cu and noble metals, such as Ag, Pd, Au or Pt. Cu is relatively inexpensive, plentiful, is compatible with the metallurgy typically used for electronic circuit elements, possesses a melting temperature in excess of 1,000° C., is ductile, is readily available in a variety of powder forms, and is an excellent electrical and thermal conductor.

Ag is also specifically contemplated as a HMP metals for use in the invention compositions, particularly in applications in which copper particles would be vulnerable to subsequent manufacturing processes (e.g. copper etching), or in cases in which the use of a noble metal would substantially increase the net metal loading and thereby reduce the need for flux.

In some applications, Al, Pd, Be, Rh, Ni, Co, Fe, Mo can be selected as alternative choices for use in the invention as a HMP metal. Each of these metals, or more than one of them, can be used instead of, or in addition to, any of Cu, Au, Pt, Ag, or any combination thereof, (i.e., as a substitute or supplement to the metal(s) listed above as acceptable HMP metal(s)).

Component (B), the second metallic particle, includes a reactive, LMP metal, alloyed with at least one carrier metal. The LMP metal alloy represents at least 10 mass % of the low melting temperature metal components (i.e., Components (B) and (C)). At temperature $T_1$ (discussed below), the LMP metal alloy is molten.

Component (C), the LMP metal-rich particle, which may be an alloy or an elemental form of the LMP metal, contains at least 40% by mass of the reactive, LMP metal. In certain embodiments, at least about 60%, 70%, 80%, 90%, 95% or more, such as 96%, 97%, 98, 99 or 100% of the LMP metal-rich particle is the LMP metal. Where the LMP metal is tin, LMP metal-rich particles may contain 90-100% Sn, with the balance being a carrier metal, such as Bi, In, Pb, Au, Ni or combinations thereof.

Typically, the LMP metal of Components (B) and (C) are the same metal. However, combinations of metals having a melting temperature below about 400° C. are also contemplated for use in the invention. Furthermore, the LMP metal of Component (B) may be, and often is, but need not necessarily be, the same metal as the LMP metal of Component (C). Where the LMP metal is different in components (B) and (C), the LMP metals should each independently form intermetallics with the HMP metal(s) of Component (A) and be suitably interchangeable in the LMP alloys of Component (B).

In some embodiments, the second metallic particle (Component (B), is eutectic, and the LMP metal-rich particle (Component (C)) is non-eutectic. The composition may further include metallic additive(s), which can be selected by those having ordinary skill in the art so that the products of the transient liquid phase sintering reaction will have the optimum combination of attributes for the intended application. The attributes that may be considered typically encompass thermally stable resistance, ductility, high electrical and thermal conductivity, coefficients of thermal expansion similar to the surrounding materials, and the like.

Sn is one example of a metal that may be utilized as the reactive LMP metal in the alloy of component (B), and Sn may, of course, also be present in metallic particle of component (C), such that the LMP metal-rich particle is a "tin-rich" alloy, as disclosed herein.

Non-limiting examples of other reactive LMP metal(s) that may be used in the particles of the invention include Bi, Zn, Ga, In, Te, Hg, Tl, Sb, Se, Po and combinations thereof. Another metal or alloy may be also used, provided it has a constituent element that is reactive with the metal of the above-mentioned component (A), i.e., with at least one HMP metal.

Non-limiting examples of carrier metal(s) that may be used in the alloy particles of component (B), the LMP metal alloy, include Bi, In, Pb, Ag, Cu, Sb, Au and combinations thereof. Accordingly, the second metallic particle may be formed from any reactive metal(s) mentioned above and any carrier metal(s) mentioned above, and both the reactive metal(s) and the carrier metal(s) may be incorporated as particulates of one or more of the following exemplary alloy families: Sn/Bi, In/Sn, Pb/Sn, Sn/Pb/Bi, Sn/Ag, Sn/Cu, Sn/Ag/Cu, Sn/Ag/Cu/Sb, Bi/In/Sn, Sn/In/Ag, Sn/Sb, Au/Sn and combinations thereof. In some embodiments, the LMP metal alloy is a Sn/Bi alloy.

The ratios between the reactive and carrier metals in the second metallic particle may vary. For example, the second metallic particles of Component (B) may include between about 35 mass % and about 65 mass % of the reactive LMP metal, such as about 40 mass % or about 42 mass % of the reactive metal, with the balance being the carrier metal. In one exemplary embodiment mentioned above, where the LMP metal alloy is a Sn/Bi alloy, it may include about 42 mass % of Sn, or, alternatively, about 40 mass % of Sn, and the balance of Bi.

A desired composition of the above-mentioned components may be achieved by using combinations of readily available alloys and elemental metals. The combination of metal and alloy powder components comprising the Component (B) includes at least one powder that will melt and interact with the other constituents at the selected process temperature $T_1$. When combined in inventive TLPS compositions, the commercially available alloys combine to form the desired alloy composition in situ. In other words, the mixture of particles containing components (B) and (C) is such that some portion of it becomes molten at the process temperature to render the full complement of reactive LMP metal species within the alloy available for reaction with the HMP metal in the above-mentioned component (A) prior to vitrification of any polymers in the composition.

Not all of the metals and alloys to be combined need have a melting point below the intended process temperature, provided that the higher melting LMP metals and/or alloy compositions (C) are soluble in the alloy composition(s) (B), that have a melting point below the process temperature $T_1$ which are therefore molten at the process temperature. At least 10% of the particulate species of Component (B) must become molten to ensure that all the Component (B) and (C) particles are made available through regeneration of the molten alloy as the LMP metal of the component (B) is depleted by reaction with the HMP metal of component (A).

The above-mentioned organic vehicle may simply be a carrier for the metallic particles, serving to hold the mixture together for easy of application and to keep the various particles in close proximity to each other. More typically, the organic vehicle provides a flux activity, particularly when a HMP metal is a non-noble metal, and may provide a mechanism for self-inerting the flux in applications in which there is no opportunity for the flux to be driven off during processing. The organic vehicle may further include thermoplastic materials that allow the TLPS composition to be shaped as desired prior to processing, and may contain polymer precursors and/or other compounds and solvents that react to form an interpenetrating matrix with the metallic network during processing.

The organic vehicle of the invention composition serves to make the metallic reagents available for reaction and to protect them from the environment, much as a solvent does in an organic reaction. Several factors determine the selection of an appropriate solvent for an organic reaction (e.g. polarity, protic or aprotic, miscibility with water, etc.). Likewise, the organic vehicle in the compositions of the present invention is selected for appropriate attributes. The most critical attribute of the organic vehicle is that it must remove the metallic oxides from the surfaces of the metallic reagents to make said reagents available for reaction. Removal of the metallic oxides is referred to as "fluxing" and may be accomplished by a variety of chemical species known to those of skill in the art, including organic acids and strong bases. Other attributes of the organic vehicle are selected on an application-specific basis. For instance, in an application in which invention metallic compositions are employed as a solder paste replacement, the entire organic vehicle may be formulated to volatilize during processing. In applications in which invention metallic compositions are employed in adherent coatings on nonmetallic surfaces, the organic vehicle may be selected for adhesive properties. Therefore, aside from the necessity for a fluxing component, the organic vehicle may include a wide variety of organic constituents that are well known in the art.

The constituents of the organic vehicle may be selected by those having ordinary skill in the art in accordance with the requirements of the application to meet specific deposition, processing, adhesion or other performance characteristics. In some embodiments, the organic vehicle may be comprised of a combination of a flux and a resin. Those skilled in the art can select both the flux and the resin from the products commonly used for these purposes. As a non-limiting example, an epoxy material may be used as a resin.

The present invention also provides lead-free mixed particle compositions. As substitutes for existing lead-containing compositions, the selection of suitable lead-free reactive metals and alloys thereof, for the above-described Components (B) and (C) is particularly challenging. The first limiting constraint is process temperature. Lead has been chosen in this regard in the past due to its relatively low melting temperature, which is highly compatible with electronics applications, but is now excluded due to toxicity. The process temperature for the TLPS composition should be low enough that the other materials used in the production of the electronic article are not damaged. A ceiling of 300° C. is typically set as the maximum process temperature for electronic applications comprising polymeric components. Process temperatures of 230° C. or less are considered preferable for many applications. Accordingly, candidates for the reactive metal and its alloys include tin, bismuth, indium, gallium, and zinc. Although suitable, elemental or alloyed Ga and In are prohibitively expensive and not readily available. Elemental or alloyed Zn is incompatible with many common circuit finishes. Alloys that are predominantly composed of Sn have melting temperatures in excess of the preferred process window and may form brittle Cu/Sn intermetallics as the exclusive end products if used with Cu particles, in addition to creating a potential for the formation of Sn whiskers. Accordingly, alloys of Bi and Sn present a desirable combination of attributes, although the addition of other elements may be helpful in achieving specific characteristics that may be desired.

Alloys of Bi and Sn meet many of the requirements outlined above; however, they also present some deficiencies. Alloys of Bi and Sn are readily available at reasonable cost in particulate form. The melting temperature of most common Bi—Sn alloys is within the range of about 135° C. to about 200° C. The Sn in Bi/Sn alloys and the intermetallics formed when Sn reacts with Cu are all very good electrical and thermal conductors. The residual elemental Bi and Cu/Sn intermetallics formed by the TLPS reaction each have melting temperatures outside the range of typical subsequent thermal processing and testing. Sn and Bi are not considered toxic and are compatible with all typical metal circuit finishes. Unfortunately, both Bi and Cu/Sn intermetallics are brittle and therefore susceptible to damage when exposed to mechanical stress. Further, elemental Bi is a poor electrical conductor and a very poor thermal conductor.

Alloys of Bi and Sn used in conjunction with Cu or a noble metal as the HMP metal of the above-mentioned Component (A) offer many desirable characteristics and the present invention provides a means to employ this metallurgy in a manner that minimizes the deficiencies. The low electrical and thermal conductivity and brittleness of Bi are the primary deficiencies. Therefore, it is desirable to minimize the proportion of Bi in the composition. This can be accomplished by creating an alloy composition with a higher proportion of tin than in the known eutectic alloys, and other readily available, commercial Bi/Sn alloys.

Further, it may be desirable to combine Bi with other metals that would render the residual, post-TLPS alloy more ductile or conductive. Although it is theoretically possible to create a custom alloy composition by smelting the desired elements together in the desired proportions and producing particles of a LMP metal alloy, practically, it may be difficult to produce particles in which the specific proportion of elements is present in each of the particles, especially when more than three elemental constituents are included. In some embodiments, the Bi could be minimized and modified through the use of a blend of readily commercially available alloys.

Although alloys of Sn and Bi are presented as an embodiment of the invention in the foregoing discussion, the inventive concept of blending alloy and metal particles to achieve a specific metallurgical composition and resultant microstructure after processing is understood to be widely applicable to other metal systems and applications. The use of additional reactive LMP metal(s) in combination with the HMP metal is also contemplated in order to obtain TLPS reaction products with optimal characteristics. While not wishing to be bound by theory, it is believed that additive metals alter the grain structure, extent of interdiffusion, and rate of formation of the matrix from components (A), (B) and (C) during processing of TLPS compositions. It is further believed these structural alterations provide a wide variety of benefits to the composition for specific applications, such as promoting greater flexibility and the like. Optional metal additives can be added as separate particles, as a coatings on or pre-alloyed with the HMP metal or one of the reactive metals of the above-mentioned particles. The size of particulate additives may range from the order of nanometers to about 20 µm to about 100 µm. Non-limiting examples of such additives include B, Al, Cr, Fe, Ni, Zn, Ga, Ag, Pd, Pt, Au, In, Sb, Bi, Te, Mn, P and Co, and combinations thereof.

The present invention also provides methods for preparing the above-described compositions. Each of the above-described components and metallic particles may be selected from commercially available materials. Components (A), (B) and (C) may be prepared in a form of particles of a desirable size, for example, particles having the diameter between about 1 µm and about 20 µm. A proper amount of each component can then be weighed, and the three components can be combined and mixed together using known methods. The final composition can include one or more types of the particles incorporated in a combination of one or more particle sizes or size distributions.

In some embodiments, at least one type of the metallic particles of the composition may include a metallic coating on a non-metallic core. This non-metallic core may be comprised of glass, ceramic or polymeric material. In some embodiments, the particles may be sieved to remove particles above a certain size or to reach a particularly desired particle size distribution, for example, to achieve the maximum particle size which is about 20 µm.

Following preparation, the composition can then be used in a variety of applications. For example, after processing at a temperature at or about $T_1$, intermetallic species can be formed between the reactive metal of the LMP metal alloy of the above-described components (B) and (C) and the HMP metal of the above-described component (A) for between about 1 and about 60 minutes.

In some embodiments, when the reactive LMP metal in particles (B) and (C) is Sn, and the HMP metal (particle A) is Cu, there is insufficient Sn to convert the entire quantity of the Cu to Cu—Sn intermetallics. In other embodiments, the quantity of Sn is sufficient to convert the entire quantity of the Cu to Cu—Sn intermetallics. In yet other embodiments, the quantity of Sn is in excess of what is sufficient to convert the Cu to the 6:5 molar ratio Cu—Sn intermetallic. If the quantity of Sn is so excessive, the excess Sn is alloyed with one or more other elements present in the composition such that there remains a residual molten phase at temperature $T_1$, which is in the range between about 80° C. and about 300° C., typically between about 100° C. and about 250° C., often between about 150° C. and about 230° C., and most frequently between about 190° C. and about 210° C.

Following formation, intermetallic species can grown to metallurgically join and form interconnected networks that are electrically and mechanically stable through subsequent thermal excursions. Generally, the processing temperature $T_1$ may be between room temperature (i.e., about 20° C.) and about 300° C., such as between about 80° C. and about 250° C., for example, between about 100° C. and about 230° C., or between 190° C. and about 220° C. The intermetallic species will have a minimum melting temperature not less than 10° C. above $T_1$.

In the process of making the compositions of the instant invention, in some embodiments, the three components typically react at a processing temperature $T_1$ as mentioned above. As a result, substantially the entire quantity of the reactive HMP metal and/or the reactive LMP metal present in the mixture may be exhausted. In other embodiments, to achieve such an exhaustion of the reactive HMP metal and/or the reactive LMP metal present in the mixture, the components may be reacted at temperature that is higher than the processing temperature $T_1$, for instance, at least 10° C. higher. In other embodiments, particles (C) having a melting temperature that is at least 10° C. higher than the processing temperature $T_1$ are soluble in the particles (B) which contain the low melting point component(s) and are molten at the processing temperature $T_1$.

The metallurgical networks so formed are useful for electrically, thermally and/or mechanically connecting elements within electrical structures. Examples of applications in which inventive compositions are useful are connecting semiconductor dies to packaging elements, connecting packaged semiconductor components to printed circuit boards, connecting other discrete components to electronic substrates, forming connections between stacked die, as circuit traces, to fill holes in electronic substrates, to interconnect circuit layers in printed circuit boards and/or semiconductor packages, to form collection grids for solar panels, to form electrically conductive pillars, cylinders or columns, to electrically interconnect electrical subsystems through interposer structures, and the like.

The above-described compositions can be applied using various techniques, including, but not limited to, needle dispensing, stenciling, screen printing, ink jetting, extrusion, casting, spraying or other methods that would be known to those of skill in the art. Once applied, the described compositions are thermally processed in an oven, on a hot plate, in a lamination press, or by other means typically employed for the processing of solder or filled organic adhesives. The specific thermal process conditions are dependent upon the application as well as selection of the TLPS system and any organic binder constituents.

In some instances, strict control of the particle size distribution, generally achieved through hard sieving, can enable applications by rendering said compositions suitable for deposition techniques such as dispensing, ink jetting and the like.

EXAMPLES

The invention will now be further described with reference to by the following illustrative, non-limiting examples.

Example 1

To exemplify the above-described features of the invention, two or more different, but compatible, alloys were combined by mixing to form a non-standard or "blended" alloy in situ. All of the alloy powder constituents need not be molten at the desired process temperature provided that at least one of the metallic alloy powders becomes molten and that the non-molten alloy constituents are highly soluble in the molten constituent. For example, one way of mitigating the potentially deleterious characteristics of Bi in a conductive compositions is by employing an alloy of Sn and Bi in which the proportion of Bi is substantially reduced. Such an alloy is not commonly available; however, alloy powders of eutectic Sn—Bi as well as alloys predominantly comprising Sn are readily available.

Three compositions A, B and C were prepared summarized below in Table 1.

TABLE 1

| Compositions A, B and C | | | |
|---|---|---|---|
| Component | Composition A | Composition B | Composition C |
| 58/42 (mass %) Bi/Sn alloy, g | | 38.12 | 9.91 |
| 40/60 (mass %) Bi/Sn alloy, g | 49.47 | | |
| SAC 305*, g | | 16.07 | 19.41 |
| 52/48 (mass %) In/Sn alloy, g | | | |

TABLE 1-continued

| Compositions A, B and C | | | |
|---|---|---|---|
| Component | Composition A | Composition B | Composition C |
| Cu, g | 60.28 | 60.00 | 20.57 |
| Organic vehicle*** | 15.29 | 15.26 | 6.04 |

*Here and below, an alloy of about 95.5 mass % of Sn, about 3.7 mass % of Ag and about 0.8 mass % of Cu
** Includes about 82 mass % of Sn in the composition.
***Here and below, organic vehicle is a mixture containing Methyl tetrahydrophthalic anhydride monoglycerin ester (1.35 g); triethanolamine (1.00 g); Bisphenol A in a 50% weight solution with butyl carbitol (2.96 g); Araldite MY721 epoxy resisn (0.74 g) and Butyl carbitol (0.2 g).

The above described compositions A, B and C contained the quantities of Cu, Sn and Bi (as percentages of the total metal contents in the composition) given in Table 2.

TABLE 2

| Quantities of Metals in Compositions A, B and C | | | |
|---|---|---|---|
| Component | Composition A | Composition B | Composition C |
| Sn, % of the total metal contents | 27 | 27 | 47 |
| Bi, % of the total metal contents | 18 | 18 | 12 |
| Cu, % of the total metal contents | 55 | 54 | 41 |

The process temperature was selected to be about 190° C., at which temperature a eutectic Sn/Bi alloy powder melts, homogenizes with one of the predominantly Sn alloy powders, such as SAC 305, and the tin from both sources reacts with Cu powder in the presence of fluxing organic binder (e.g., organic vehicle). Although the predominantly Sn powder does not melt, all of the Sn in the composition becomes reacted with Cu within a few moments. In this case, the predominantly Sn alloy is soluble in the molten eutectic Sn/Bi alloy, and, as Sn within the eutectic composition reacts with Cu, the dissolved Sn replenishes it by effectively creating more eutectic alloy in situ.

Figure 2:
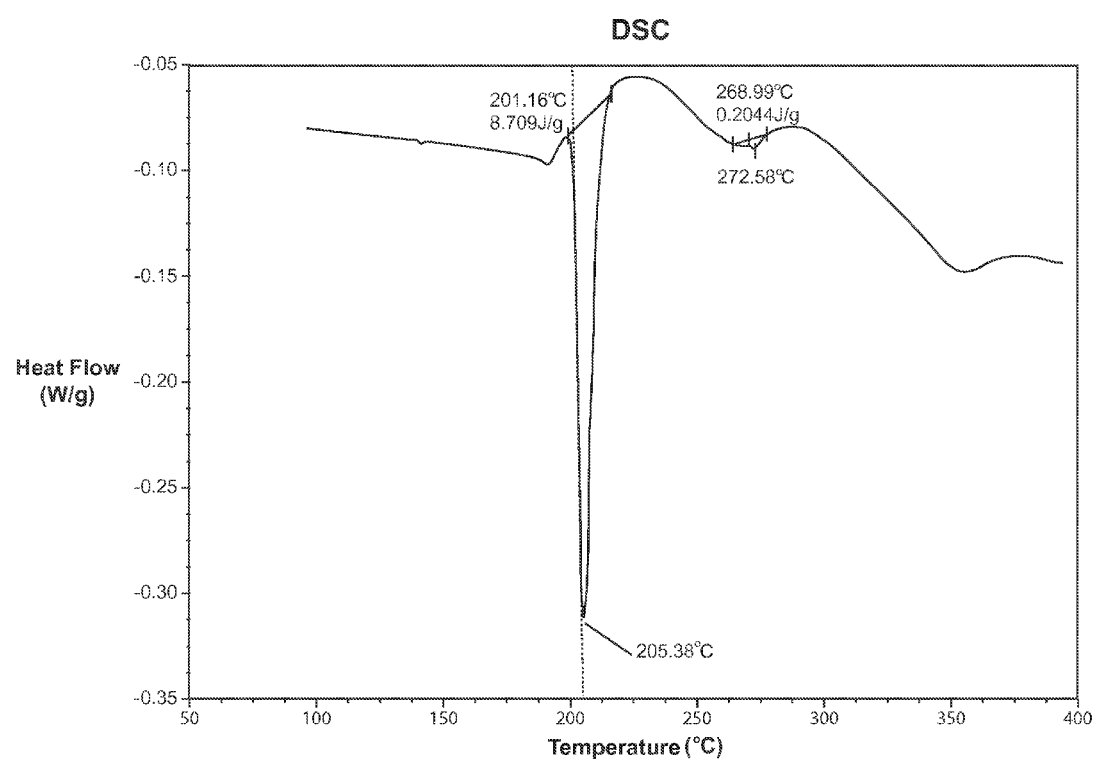
FIG. 2 illustrates a DSC analysis of the processed, non-standard alloy TLPS composition.

Some properties of the composition prepared as described above are demonstrated by differential scanning calorimetry (DSC), as illustrated in FIGS. 1-4. FIGS. 1 and 2 depict a TLPS composition A of Table 1. FIG. 1 depicts the TLPS reaction as the composition is heated from room temperature to about 190° C., and is held at that temperature for about ten minutes. The first downward peak (endotherm) reflects the melting of the non-standard alloy and the following upward peak is the exothermic formation of copper-tin intermetallics. FIG. 2 depicts a thermal excursion of the sample processed in FIG. 1. The signature in FIG. 2 is substantially different from that in FIG. 1 since new reaction products have formed and further exothermic reactions are not seen during the subsequent excursion.

Figure 3:
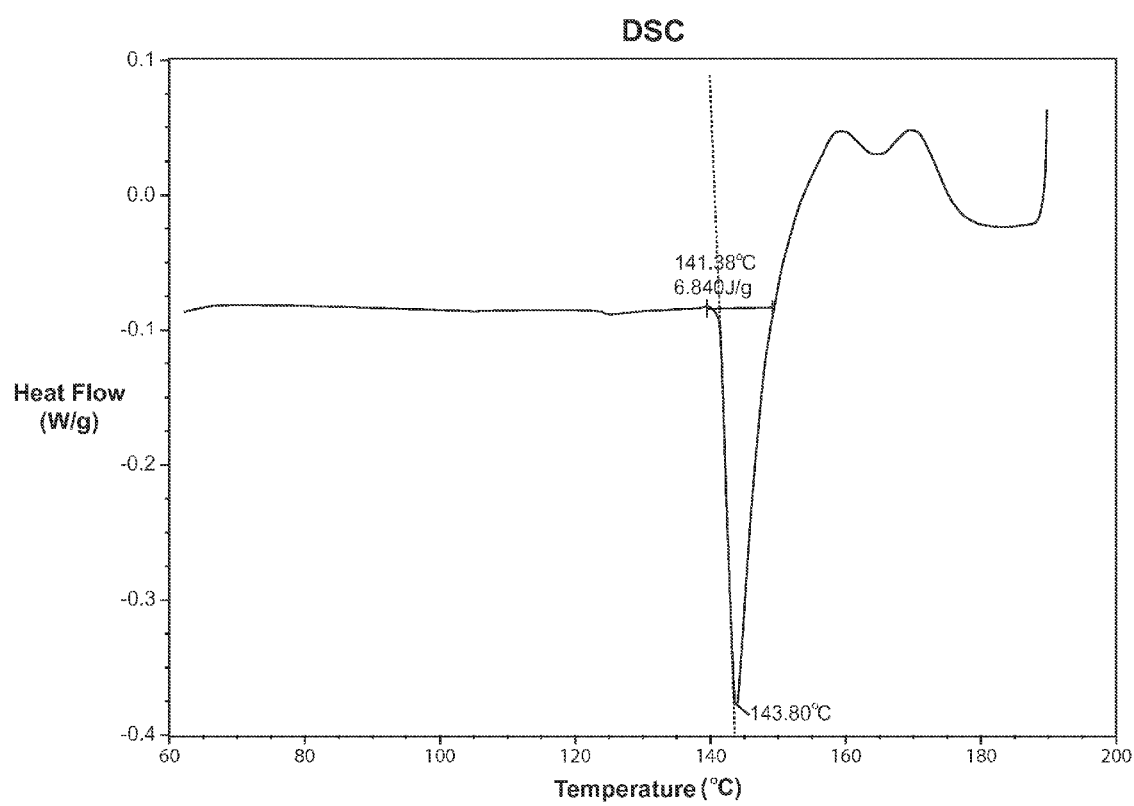
FIG. 3 is a DSC diagram illustrating a 190° C. processing of the blended-alloy elemental equivalent of the composition of FIG. 1.
Figure 4:
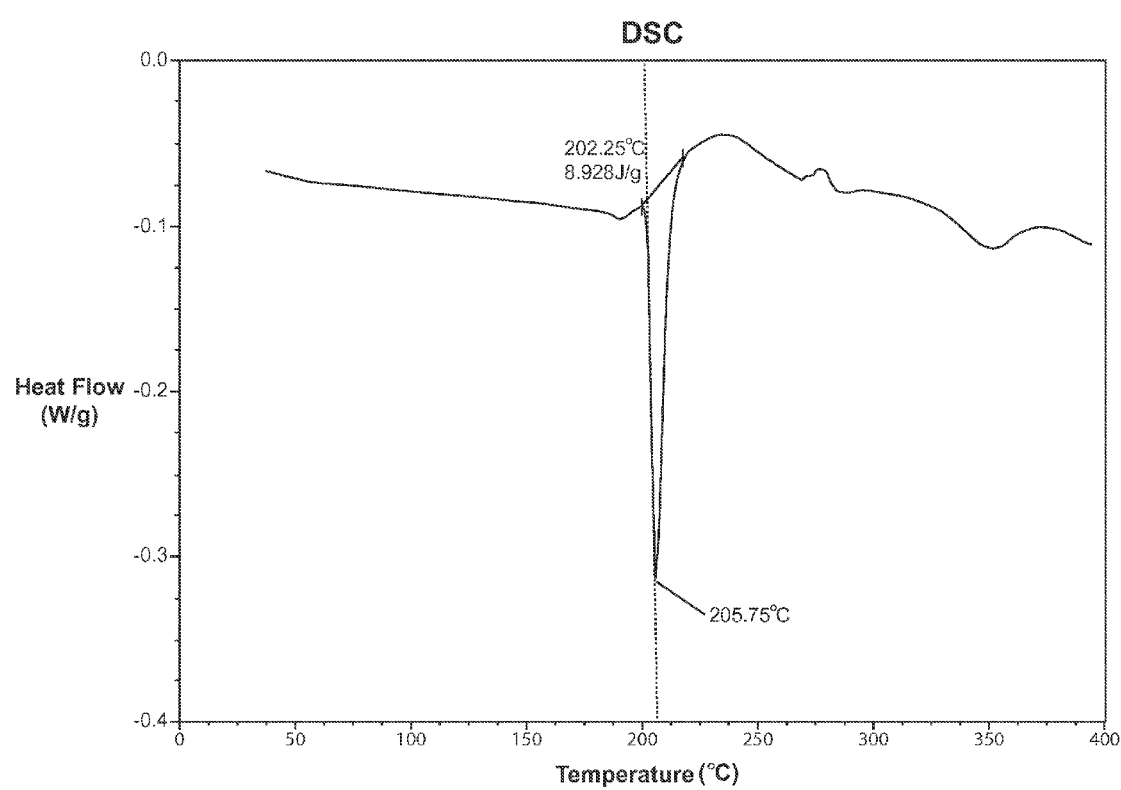
FIG. 4 illustrates a DSC analysis of the TLPS composition shown processed in FIG. 3.

FIGS. 3 and 4 depict the DSC analysis of composition B of Table 1, which has the same overall elemental composition as composition A; however, in composition B, the equivalent proportions of Sn and Bi were achieved by blending the eutectic Sn/Bi powder with a predominantly Sn powder (i.e., SAC 305), which melts at about 217° C. The initial process scan (FIG. 3) looks very similar to that of FIG. 1 under identical process parameters. Also, during the second thermal excursion depicted in FIG. 4, not only does the signature look similar to that of FIG. 2, there is little evidence of the original predominantly Sn alloy—even though the process temperature of 190° C. was well below the melting temperature of the alloy. This phenomenon has been observed in TLPS compositions in which the proportion of non-molten to molten alloy phase was as high as 3:1, resulting in a substantial decrease in the proportion of undesirable Bi in the composition.

Example 2

Two or more different, but compatible alloys were combined. The composition was prepared by mixing the following ingredients: about 4.0 g of Bi/Sn alloy containing about 58 mass % of Bi and about 42 mass % of Sn; about 8.5 g of SAC 305 described in Example 1; about 4.0 g of the eutectic In/Sn alloy containing about 58 mass % of In and about 42 mass % of Sn; about 30.0 g of Cu; and about 5.0 g of the organic vehicle.

The above described composition contained about 65 mass % of Cu, about 25 mass % of Sn and about 5 mass % of Bi (as percentages of the total metal contents in the composition).

The process temperature was about 190° C., at which temperature the first and third alloys described above melted, homogenized with the second alloy and reacted with Cu, such that several intermetallic and/or alloy species were created simultaneously. As can be seen, the eutectic In/Sn alloy, which is the least expensive and most readily available of the indium alloys, was blended with a Bi/Sn alloy powder. By combining the two alloys, the expense of In can be mitigated and the poor electrical, thermal and mechanical performance of Bi can be minimized.

Figure 5:
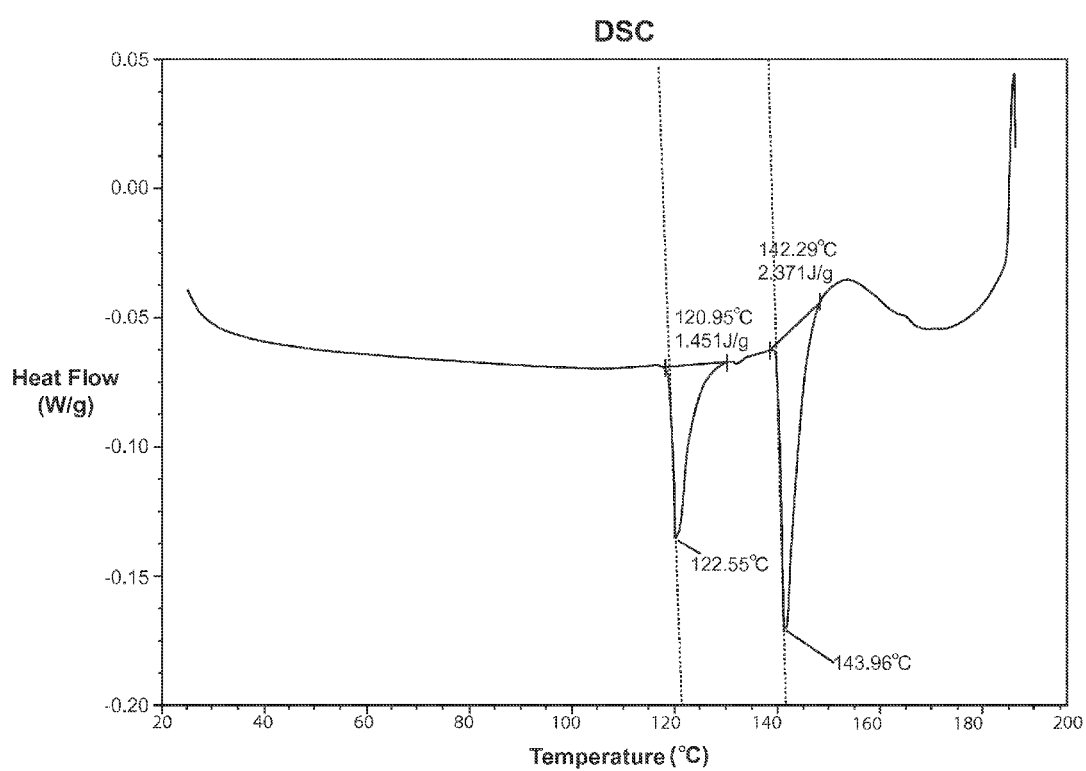
FIG. 5 is a DSC diagram illustrating processing of a TLPS composition comprising both a SnIn and a SnBi alloy in conjunction with copper at 190° C.
Figure 6:
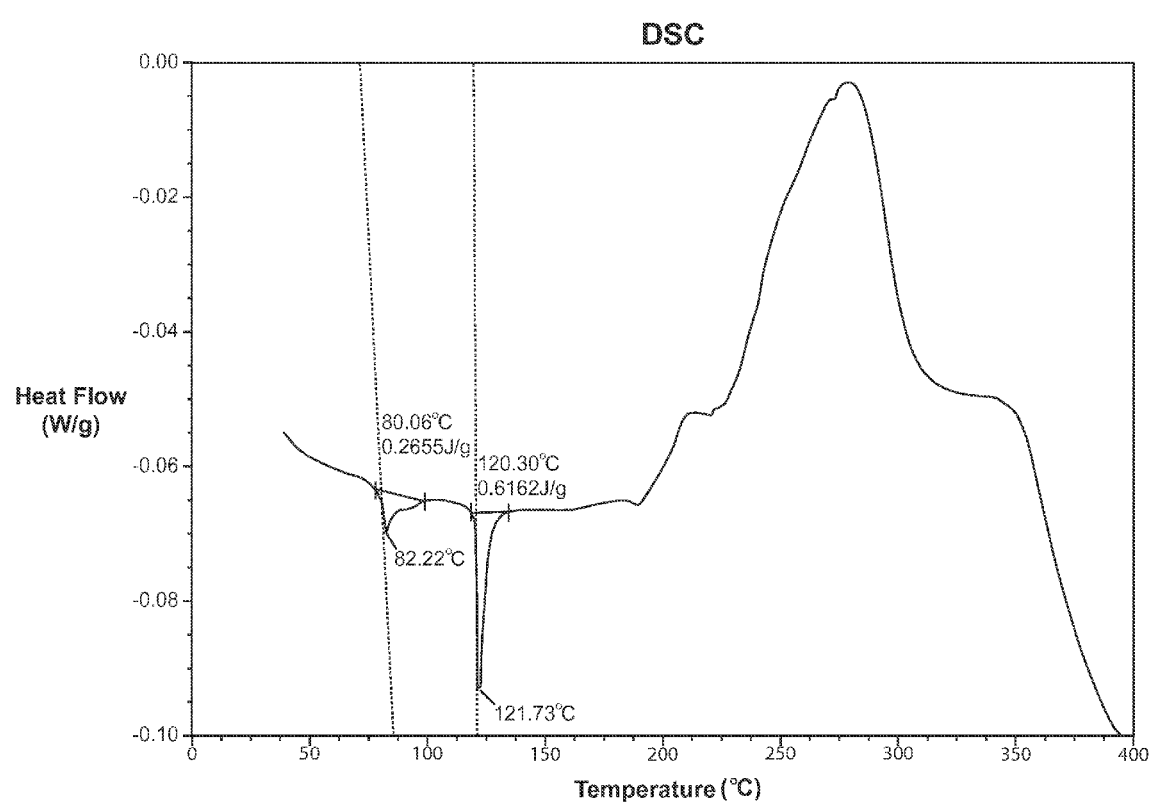
FIG. 6 illustrates a DSC analysis of the processed TLPS composition of FIG. 5.

At 190° C., both the In/Sn alloy and the Bi/Sn alloy and the tin made available by these facilitating alloys from the SAC 305 can react with the copper particles to form Cu/Sn intermetallics In would further react with both Cu and Bi to form additional intermetallics. This reaction is depicted in the DSC scan in FIG. 5. The formation of intermetallic species is favorable because they provide stable, regular crystalline structures. The stability of these microstructures is evidenced by the lack of exothermic and endothermic features in the subsequent DSC scan of the processed composition depicted in FIG. 6. Thus, by combining the two alloys the optimum balance of cost and performance was achieved.

Examples 3-10

Various compositions were prepared by mixing the indicated compounds in the quantities shown in the following Table 3.

TABLE 3

Compositions of Examples 3-10

| Component | Example No. | | | | | | | |
|---|---|---|---|---|---|---|---|---|
| | 3 | 4 | 5 | 6 | 7 | 8 | 9 | 10 |
| 1 mµ Cu (spherical) | 3.11 | 3.06 | 4.52 | 6.17 | 2.95 | 2.50 | 2.60 | 2.22 |
| 3 mµ Cu (spherical) | 16.14 | 15.89 | 16.05 | 14.40 | 15.48 | 13.14 | 13.51 | 11.66 |
| 5-15 mµ 60/40 (mass %) Sn/Bi (non-eutectic) | | | 14.38 | 14.38 | 15.64 | 17.04 | | |
| sub 625 mesh 42/58 (mass %) SnBi (eutectic) | 14.97 | 14.95 | | | | | 16.76 | 17.87 |
| sub 625 mesh 99.3/0.07 (mass %) Sn/Cu | 15.72 | | 14.95 | 14.95 | 15.83 | 17.22 | 17.04 | 18.15 |
| sub 625 mesh SAC 305 | | 16.06 | | | | | | |
| Organic Vehicle (as above) | 6.04 | 6.04 | 6.04 | 6.04 | 6.04 | 6.04 | 6.04 | 6.04 |
| Total | 55.98 | 55.99 | 55.94 | 55.94 | 55.94 | 55.94 | 55.94 | 55.94 |

The compositions shown in Table 3 contained the quantities of specific metals shown in Table 4.

TABLE 4

Quantities of Metals in Compositions of Examples 3-10

| Component | Example No. | | | | | | | |
|---|---|---|---|---|---|---|---|---|
| | 3 | 4 | 5 | 6 | 7 | 8 | 9 | 10 |
| Total Composition, g | 55.98 | 55.99 | 55.94 | 55.94 | 55.94 | 55.94 | 55.94 | 55.94 |
| Total Cu, g | 19.25 | 18.94 | 20.57 | 20.57 | 19.80 | 16.80 | 17.30 | 14.90 |
| Total alloy, g | 30.69 | 31.00 | 29.33 | 29.33 | 33.80 | 36.80 | 36.30 | 38.70 |
| Cu, mass % of total metals | 39 | 38 | 41 | 41 | 37 | 31 | 32 | 28 |
| Sn, mass % of total metals | 44 | 43 | 47 | 47 | 50 | 55 | 48 | 51 |
| Bi, mass % of total metals | 17 | 17 | 12 | 12 | 13 | 14 | 19 | 21 |
| Ag, mass % of total metals | 0 | 1 | 0 | 0 | 0 | 0 | 0 | 0 |
| Cu, atomic % of total metals | 57 | 57 | 59 | 59 | 55 | 48 | 51 | 45 |
| Sn, atomic % of total metals | 35 | 35 | 36 | 36 | 40 | 45 | 40 | 45 |
| Bi, atomic % of total metals | 8 | 8 | 5 | 5 | 6 | 6 | 9 | 10 |
| Ag, atomic % of total metals | 0 | 1 | 0 | 0 | 0 | 0 | 0 | 0 |

Compositions of Examples 3-5, 8 and 9 were tested for bulk resistivity and the change in bulk resistivity after 4 weeks at about 150° C. The results are shown in Table 5.

TABLE 5

Bulk Resistivity of Compositions of Examples 3-5, 8 and 9

| Bulk Resistivity | Example No. | | | | |
|---|---|---|---|---|---|
| | 3 | 4 | 5 | 8 | 9 |
| Initial, micro-ohm * cm | 143.50 | 134.90 | 125.70 | 123.20 | 170.90 |
| % change after 4 weeks at 150° C. | 27.60 | 17.25 | 19.04 | 12.50 | 69.00 |

Examples 11-18

Additional compositions were prepared by mixing the compounds in the quantities shown in Table 6.

TABLE 6

Compositions of Examples 11-18

| Component | Example No. | | | | | | | |
|---|---|---|---|---|---|---|---|---|
| | 11 | 12 | 13 | 14 | 15 | 16 | 17 | 18 |
| 1 mμ Cu (spherical) | 3.55 | 4.16 | 4.83 | 3.05 | 4.10 | 3.32 | | 3.92 |
| 3 mμ Cu (spherical) | 12.56 | 9.71 | 11.27 | 10.82 | 9.57 | 17.25 | 27.00 | 20.39 |
| 5-15 mμ 60/40 (mass %) Sn/Bi (non-eutectic) | | | | | | | 22.15 | |
| sub 625 mesh 42/58 (mass %) SnBi (eutectic) | 16.76 | 17.87 | 16.76 | 17.87 | 17.62 | 9.91 | | 12.34 |
| sub 625 mesh 99.3/0.07 (mass %) Sn/Cu | 17.04 | 18.15 | 17.04 | 18.15 | | 19.41 | | |
| sub 625 mesh SAC 305 | | | | | 18.62 | | | 13.25 |
| resin | | | | | | | 3.35 | |
| flux-curing agent | | | | | | | 1.52 | |
| flux | | | | | | | 1.12 | |
| resin 2 | | | | | | | 0.84 | |
| Organic Vehicle (as above) | 6.04 | 6.04 | 6.04 | 6.04 | 6.04 | 6.04 | | 6.04 |
| Total | 55.94 | 55.94 | 55.94 | 55.94 | 55.94 | 55.93 | 55.98 | 55.94 |

The compositions shown in Table 6 contained the quantities of specific metals shown in Table 7.

TABLE 7

Quantities of Metals in Compositions of Examples 11-18

| Component | Example No. | | | | | | | |
|---|---|---|---|---|---|---|---|---|
| | 11 | 12 | 13 | 14 | 15 | 16 | 17 | 18 |
| Total Composition, g | 55.94 | 55.94 | 55.94 | 55.94 | 55.94 | 55.93 | 55.98 | 55.94 |
| Total Cu, g | 17.30 | 14.90 | 17.30 | 14.90 | 13.67 | 20.57 | 27.00 | 24.31 |
| Total alloy, g | 36.30 | 38.70 | 36.30 | 38.70 | 36.23 | 29.32 | 22.15 | 25.59 |
| Cu, mass % of total metals | 32 | 28 | 32 | 28 | 27 | 41 | 55 | 49 |
| Sn, mass % of total metals | 48 | 51 | 48 | 51 | 50 | 47 | 27 | 36 |
| Bi, mass % of total metals | 19 | 21 | 19 | 21 | 20 | 12 | 18 | 14 |
| Ag, mass % of total metals | 0 | 0 | 0 | 0 | 1 | 0 | 0 | 1 |
| Cu, atomic % of total metals | 51 | 45 | 51 | 45 | 45 | 59 | 73 | 67 |
| Sn, atomic % of total metals | 40 | 45 | 40 | 45 | 44 | 36 | 19 | 26 |
| Bi, atomic % of total metals | 9 | 10 | 9 | 10 | 10 | 5 | 7 | 6 |
| Ag, atomic % of total metals | 0 | 0 | 0 | 0 | 1 | 0 | 0 | 1 |

Compositions of Examples 15 and 17 were tested for bulk resistivity and the change in bulk resistivity after 4 weeks at about 150° C. The results are shown in Table 8.

TABLE 8

Bulk Resistivity of Compositions of Examples 15 and 17

| Bulk Resistivity | Composition of Example 15 | Composition of Example 17 |
|---|---|---|
| Initial, micro-ohm * cm | 228.20 | 115.50 |
| % change after 4 weeks at 150° C. | 14.94 | 40.69 |

Examples 19-26

Yet additional compositions were prepared by mixing the compounds in the quantities shown in Table 9.

TABLE 9

Compositions of Examples 19-26

| Component | Example No. | | | | | | | |
|---|---|---|---|---|---|---|---|---|
| | 19 | 20 | 21 | 22 | 23 | 24 | 25 | 26 |
| 1 mµ Cu (spherical) | 15.64 | 3.32 | 3.32 | 4.12 | 4.26 | 4.42 | 4.59 | |
| 3 mµ Cu (spherical) | | 17.25 | 17.25 | 21.50 | 22.22 | 23.10 | 23.97 | |
| 3 mµ Ag (spherical) | | | | | | | | 20.57 |
| 5-15 mµ 60/40 (mass %) Sn/Bi (non-eutectic) | | 14.38 | | | | | | |
| sub 625 mesh 42/58 (mass %) SnBi (eutectic) | 17.87 | | 10.00 | 11.99 | 11.74 | 11.74 | 11.72 | 10.00 |
| sub 625 mesh 99.3/0.07 (mass %) Sn/Cu | 18.88 | | | | | | | |
| sub 625 mesh SAC 305 | | 15.56 | 20.20 | 12.39 | 11.81 | 10.77 | 9.77 | 20.20 |
| Organic Vehicle (as above) | 6.04 | 6.04 | 6.04 | 6.04 | 6.04 | 6.04 | 6.04 | 6.04 |
| Total | 58.43 | 56.55 | 56.81 | 56.03 | 56.07 | 56.07 | 56.08 | 56.81 |

The compositions shown in Table 9 contained the quantities of specific metals shown in Table 10.

TABLE 10

Quantities of Metals in Compositions of Examples 19-26

| Component | Example No. | | | | | | | |
|---|---|---|---|---|---|---|---|---|
| | 19 | 20 | 21 | 22 | 23 | 24 | 25 | 26 |
| Total Composition, g | 58.43 | 56.55 | 56.81 | 56.03 | 56.07 | 56.07 | 56.08 | 56.81 |
| Total Cu, g | 15.64 | 20.57 | 20.57 | 25.62 | 26.47 | 27.52 | 28.56 | |
| Total alloy, g | 36.75 | 29.94 | 30.20 | 24.38 | 23.56 | 22.51 | 21.49 | |
| Cu, mass % of total metals | 30 | 41 | 41 | 51 | 53 | 55 | 57 | 0 |
| Sn, mass % of total metals | 50 | 47 | 46 | 34 | 32 | 30 | 28 | 46 |
| Bi, mass % of total metals | 20 | 11 | 11 | 14 | 14 | 14 | 14 | 11 |
| Ag, mass % of total metals | 0 | 1 | 1 | 1 | 1 | 1 | 1 | 43 |
| Cu, atomic % of total metals | 48 | 58 | 58 | 69 | 71 | 73 | 74 | 0 |
| Sn, atomic % of total metals | 43 | 36 | 36 | 24 | 23 | 21 | 20 | 46 |
| Bi, atomic % of total metals | 10 | 5 | 5 | 6 | 6 | 5 | 5 | 6 |
| Ag, atomic % of total metals | 0 | 1 | 1 | 1 | 1 | 1 | 1 | 48 |

Compositions of Examples 20, 21 and 26 were tested for bulk resistivity and the change in bulk resistivity after 4 weeks at about 150° C. The results are shown in Table 11.

TABLE 11

Bulk Resistivity of Compositions of Examples 20, 21 and 26

| Bulk Resistivity | Composition of Example 20 | Composition of Example 21 | Composition of Example 26 |
|---|---|---|---|
| Initial, micro-ohm * cm | 108.50 | 121.10 | 35.40 |
| % change after 4 weeks at 150° C. | 20.56 | 23.42 | <10 |

It is well known that formulations that do not sinter well have bulk resistivities greatly in excess of 500 micro-ohm*cm and large changes in resistance (>80%) with high temperature storage. Accordingly, the values of resistivity shown in Tables 5, 8 and 11 are an indication that the formulations of the invention sinter well when processed at temperatures intermediate between the melting point of the low-temperature alloys and the tin rich alloys.

While this invention has been described with respect to these specific examples, it should be clear that other modifications and variations would be possible without departing from the spirit of this invention.

What is claimed is:

1. A particle mixture composition comprising:
   a) between about 30 mass % and about 70 mass % of the total metals in the composition of a first metallic particle, comprising at least one high melting point metal;
   b) between about 10 mass % and about 60 mass % of the total metals in the composition of a second metallic particle comprising an alloy of a reactive, low melting point metal, and a carrier metal, wherein the reactive, low melting point metal is capable of reacting with the high melting point metal to form an intermetallic;
   c) between about 25 mass % and about 75 mass % of the total metals in the composition of a third metallic particle comprising at least 90 mass % of the reactive, low melting point metal;
   and
   d) an organic vehicle.

2. The composition of claim 1, wherein the high melting point metal is selected from the group consisting of Cu, Ag, Al, Au, Pt, Pd, Be, Rh, Ni, Co, Fe, Mo and combinations thereof.

3. The composition of claim 1, wherein the high melting point metal is selected from the group consisting of Cu, Ag, Al, Au, Ni, and combinations thereof.

4. The composition of claim 1, wherein the high melting point metal is selected from the group consisting of Cu, Ag, and combinations thereof.

5. The composition of claim 1, wherein the high melting point metal is Cu.

6. The composition of claim 1, wherein the high melting point metal is Ag.

7. The composition of claim 1, wherein the first metallic particle is comprised substantially of one element.

8. The composition of claim 1, wherein the reactive, low melting point metal is selected from the group consisting of Sn, Bi, Zn, Ga, In, Te, Hg, Tl, Sb, Se, Po and combinations thereof.

9. The composition of claim 1, wherein the reactive, low melting point metal is selected from the group consisting of Sn, Bi, Ga, In and combinations thereof.

10. The composition of claim 1, wherein the reactive, low melting point metal is Sn.

11. The composition of claim 10, wherein the reactive, low melting point metal is Sn, and the high melting point metal is Cu.

12. The composition of claim 10, wherein the reactive, low melting point metal is Sn, and the high melting point metal is Ag.

13. The composition of claim 1, wherein the carrier metal is selected from the group consisting of Bi, In, Pb, Ag, Cu, Sb, Au, Ni and combinations thereof.

14. The composition of claim 2, wherein the reactive, low melting point metal is Sn and the carrier metal is Bi.

15. The composition of claim 2, wherein the second metallic particle comprises at least one of the alloy families selected from the group consisting of Bi/Sn, In/Sn, Pb/Sn, Sn/Pb/Bi, Sn/Ag, Sn/Cu, Sn/Ag/Cu, Sn/Ag/Cu/Sb, Bi/In/Sn, Sn/In/Ag, Sn/Sb, Au/Sn and combinations thereof.

16. The composition of claim 1, wherein the third metallic particle comprises an alloy of the reactive, low melting point metal.

17. The composition of claim 1, wherein the third metallic particle consists substantially of the reactive, low melting point metal in elemental form.

18. The composition of claim 1, wherein the reactive, low melting point metal comprises between about 35 mass % and about 65 mass % of the second metallic particle.

19. The composition of claim 18, wherein the reactive, low melting point metal comprises about 40 mass % of the second metallic particle.

20. The composition of claim 11, wherein there is insufficient Sn in the second metallic particle to convert all of the Cu in the first metallic particle to Cu/Sn intermetallics.

21. The composition of claim 20, wherein there is sufficient Sn in the second metallic particle plus the third metallic particle to convert substantially all of the Cu in the first metallic particle to Cu/Sn intermetallics.

22. The composition of claim 1, wherein the high melting point metal forms intermetallic species with the reactive, low melting point metal at temperature $T_1$, wherein $T_1$ is in the range between about 80° C. and about 300° C., with the further proviso that the intermetallic species have a minimum melting temperature not less than 10° C. above $T_1$.

23. The composition of claim 22, wherein the intermetallic species are metallurgically joined to form an interconnected network.

24. The composition of claim 1, wherein the second metallic particle is molten at temperature $T_1$, wherein $T_1$ is in the range between about 80° C. and about 220° C.

25. The composition of claim 24, wherein $T_1$ is in the range between about 100° C. and about 200° C.

26. The composition of claim 1, wherein at least one type of metallic particle selected from the group consisting of the first metallic particle, the second metallic particle and the third metallic particle comprises a metallic coating on a non-metallic core.

27. The composition of claim 26, wherein the non-metallic core is comprised of a material selected from the group consisting of glass, ceramic or polymeric.

28. The composition of claim 1, wherein at least one particle is sieved to remove particles above a certain size.

29. The composition of claim 28, in which the maximum particle size is about 20 μm.

30. An intermetallic product formed by the thermal processing of the composition of claim 1 at a temperature between about 80° C. and 300° C.

31. A method for fabricating the composition of claim 1, the method comprising: combining a predetermined ratio of the first metallic particle, the second metallic particle, the third metallic particle and the organic vehicle to form a mixture of components thereby.

32. The method of claim 31, wherein the organic vehicle further comprises at least one of: a resin, a polymer, a reactive monomer, a volatile solvent and a filler.

33. A method for making an electrically and thermally conductive interconnection comprising:
 a) applying an amount of the composition of claim 1 to an assembly of at least two parts, wherein the at least two parts are to be electrically and thermally interconnected;
 b) heating the composition to a temperature $T_1$, wherein $T_1$ is between about 80° C. and about 300° C., wherein the high and low melting temperature metals in the composition react to form an intermetallic, wherein the intermetallic is electrically and thermally conductive, to obtain an electrically and thermally conductive interconnection thereby.

34. The method of claim 33, wherein $T_1$ is in the range between about 100° C. and about 230° C.

35. The method of claim 33, wherein $T_1$ is in the range between about 190° C. and about 210° C.

36. The method of claim 33, wherein the intermetallic has a melting temperature that is at least 10° C. higher than $T_1$.

37. The method of claim 33, wherein at least one type of the particles containing the reactive, low melting point metal melts at a temperature that is at least 10° C. higher than $T_1$.

* * * * *